United States Patent [19]
Jou et al.

[11] Patent Number: 5,824,234
[45] Date of Patent: Oct. 20, 1998

[54] METHOD FOR FORMING LOW CONTACT RESISTANCE BONDING PAD

[75] Inventors: Chon-Shin Jou, Hsinchu-Hsien; Ting-Sing Wang, Hsinchu; Chun-Lin Chen, Hsinchu; Ming-Huan Tsai, Hsinchu; Ming-Ru Tsai, Hsinchu, all of Taiwan

[73] Assignee: Mosel Vitelic, Inc., Hsinchu, Taiwan

[21] Appl. No.: 725,122

[22] Filed: Oct. 2, 1996

[51] Int. Cl.⁶ .................................................. H01L 21/00
[52] U.S. Cl. .................. 216/18; 216/75; 216/77; 216/78; 438/706
[58] Field of Search .................. 216/18, 75, 77, 216/78; 438/706

[56] References Cited

U.S. PATENT DOCUMENTS 5,433,823   7/1995   Cain ..................................... 156/662.1

*Primary Examiner*—Mark Chapman
*Attorney, Agent, or Firm*—Laff, Whitesel, Conte & Saret, Ltd.

[57] ABSTRACT

The present invention provides a method for forming a bonding pad having a low contact resistance. The method includes steps of: a) forming a bonding pad structure on a substrate having a metal layer by forming a passivation layer over said metal layer and etching the passivation layer with a fluorine-containing gas by which a fluorine-containing layer is formed on a surface of said bonding pad structure; and b) removing the fluorine-containing layer for reducing a contact resistance of said bonding pad structure.

29 Claims, 3 Drawing Sheets

METHOD FOR FORMING LOW CONTACT RESISTANCE BONDING PAD

FIELD OF THE INVENTION

The present invention relates to a method for forming a bonding pad of a semiconductor, and especially relates to a method for forming a bonding pad having a low contact resistance.

BACKGROUND OF THE INVENTION

When a passivation layer deposition of a semiconductor device in an IC manufacturing process has been performed, the next step is to etch a contact window on the passivation layer for exposing a portion of the metal layer thereunder, so as to form a bonding pad for connecting with outside circuits before packaging the semiconductor device.

Above the passivation layer, a polymer layer such as polyimide layer is preferably deposited. Occasionally, for reducing the cycle time, a passivation layer mask is saved by directly using the polyimide layer to be a passivation etching mask. In such a case, a photosensitive polyimide is often applied to be the etching mask. Referring to FIG. 1, a bonding pad structure 5 is formed on a silicon substrate 1 having a metal layer 2, an etched passivation layer 3, and a photosensitive polyimide layer 4 which has been treated with an exposure and development procedure. The metal layer 2 is preferably an Al-Si-Cu alloy layer or an Al-Cu alloy layer. The passivation layer is preferably a silicon dioxide layer, a silicon nitride layer, a phosphosilicate glass (PSG) layer, a borophosphosilicate glass (BPSG) layer or a silicon-oxy-nitride ($SiO_xN_y$) layer.

A conventional bonding pad structure formation method can be described as below-listed steps:

A1) forming a passivation layer 3 over the metal layer 2 on a silicon substrate 1;

A2) forming a photo-resist layer over the passivation layer 3;

A3) patterning the photo-resist layer by exposure and development for exposing a portion of the passivation layer 3;

A4) removing a portion of the passivation layer 3 to expose a portion of the metal layer 2;

A5) removing the remaining portion of the photo-resist layer;

A6) forming a photosensitive polyimide layer 4 over the passivation layer 3 and the exposed metal layer 2;

A7) patterning the polyimide layer 4 by exposure and development for exposing a portion of the metal layer 2; and A8) curing the remaining portion of the polyimide layer 4 for forming the bonding pad structure 5.

It preferably further includes a step before step A8) of ashing the polyimide scum above the exposed portion of the metal layer 2 by an oxygen-containing plasma, if necessary.

For shortening the cycle time, there is another conventional method developed. It is called a direct etching process (D. E. P.), and includes steps of:

B1) forming a metal layer 2 over a silicon substrate 1;

B2) forming a passivation layer 3 over the metal layer 2;

B3) forming a photosensitive polyimide layer 4 over the passivation layer 3;

B4) patterning the polyimide layer 4 by exposure and development for forming the bonding pad window pattern on the polyimide layer 4 and exposing a portion of the passivation layer 3;

B5) curing the remaining portion of the polyimide layer 4; and

B5) removing a portion of the passivation layer 3 according to the bonding pad window pattern by a reactive ion etching (RIE), such that a portion of the metal layer 2 is exposed, and the bonding pad structure 5 is formed.

It is preferable to etch the polyimide scum over the exposed portion of the passivation layer 3 before step B5), if necessary.

The above mentioned RIE method is usually executed with a fluorocarbon plasma. The etching gas is preferably one of $CF_4$, $CHF_3$, $C_2F_6$, $C_3F_8$ or $NF_3$ gases. Such etching gases are easy to form a fluorine-containing polymer, such as the fluorocarbon polymer, adhered on the side wall of the passivation layer 3 or the surface of the exposed portion of the metal layer 2. Furthermore, the fluorine contained in the etching gas is easy to form a metal fluoride, such as aluminum fluoride, with the exposed portion of the metal layer 2. Such fluorine-containing polymer and metal fluoride, which are insulators, will increase the contact resistance of the bonding pad structure 5, so as to influence the test result of the semiconductor device, and reduce the chip yield.

SUMMARY OF THE INVENTION

An object of the present invention is to provide a method for forming a bonding pad structure having a low contact resistance.

The other object of the present invention is to provide a method for removing the fluorine-containing polymer and the metal fluoride formed in the etching process of manufacturing a bonding pad from the bonding pad structure.

A further object of the present invention is to reduce the fluorine content in the bonding pad.

A still further object of the present invention is to clean the bonding pad for decreasing the contact resistance.

In one aspect of the present invention, a method for forming a bonding pad having a low contact resistance is provided. The method includes steps of: a) forming a bonding pad structure on a substrate having a metal layer by forming a passivation layer over the metal layer and etching the passivation layer with a fluorine-containing gas by which a fluorine-containing layer is formed on a surface of the bonding pad structure; and b) removing the fluorine-containing layer for reducing a contact resistance of the bonding pad structure.

In accordance with another aspect of the present invention, the fluorine-containing gas is preferably one gas selected from $CF_4$, $CHF_3$, $C_2F_6$, $C_3F_8$ and $NF_3$ gases.

In accordance with another aspect of the present invention, the fluorine-containing layer preferably includes a fluorine-containing polymer.

In accordance with another aspect of the present invention, the fluorine-containing polymer is preferably a fluorocarbon polymer.

In accordance with another aspect of the present invention, the fluorine-containing layer preferably further includes a fluoride formed by a reaction between the fluorine-containing gas and the metal layer.

In accordance with another aspect of the present invention, the metal layer is preferably an aluminum-containing layer.

In accordance with another aspect of the present invention, the aluminum-containing layer is preferably an Al-Si-Cu alloy layer.

In accordance with another aspect of the present invention, the aluminum-containing layer is preferably an Al-Cu alloy layer.

In accordance with another aspect of the present invention, the fluoride layer is an aluminum fluoride layer.

In accordance with another aspect of the present invention, the step a) preferably includes steps of: a1) forming the passivation layer over the metal layer; a2) coating a photo-sensitive layer over the passivation layer; a3) defining a pattern of the bonding pad over the photo-sensitive layer; a4) removing a portion of the photo-sensitive layer according to the pattern of the bonding pad by exposure and development for exposing a portion of the passivation layer; a5) descuming the exposed portion of the passivation layer by an oxygen-containing plasma; a6) curing the photo-sensitive layer; and a7) etching the passivation layer by the fluorine-containing gas for removing the exposed portion of the passivation layer and exposing a portion of the metal layer.

In accordance with another aspect of the present invention, the photo-sensitive layer is preferably a photo-sensitive polyimide layer.

In accordance with another aspect of the present invention, the step b) preferably includes steps of: b1) soft-etching the bonding pad structure for removing a portion of the fluorine-containing polymer; and b2) dipping the substrate in a reducing solution for removing the fluoride and a remaining portion of the fluorine-containing polymer.

In accordance with another aspect of the present invention, the soft etching is preferably a plasma etching during a relatively short time interval.

In accordance with another aspect of the present invention, the reducing solution is preferably a basic solution.

In accordance with another aspect of the present invention, the basic solution preferably includes a tetramethyl ammonium hydroxide (TMAH).

In accordance with another aspect of the present invention, the substrate is preferably immersed in the basic solution containing about 0.375% to about 85% the TMAH by weight for about 20 minute to about 3 second respectively.

In accordance with another aspect of the present invention, the method of the present invention preferably further includes a step between step b1) and step b2): b11) etching an ash on the bonding pad structure by an oxygen-containing plasma.

In accordance with another aspect of the present invention, the present invention preferably further includes a step between step a) and step b): b0) etching an ash on the bounding pad structure by an oxygen-containing plasma.

In accordance with another aspect of the present invention, the passivation layer is preferably a silicon dioxide layer, a silicon nitride layer, a phosphosilicate glass (PSG) layer, a borophosphosilicate glass (BPSG) layer or a silicon-oxy-nitride layer.

In accordance with another aspect of the present invention, the passivation layer is preferably etched by a reactive ion etching method with the fluorine-containing gas.

In accordance with another aspect of the present invention, the reactive ion etching is preferably executed by a fluorocarbon plasma.

In accordance with another aspect of the present invention, the present invention further provides a method for forming a bonding pad having a low contact resistance, includes steps of: a) forming a bonding pad structure on a substrate having a metal layer by forming a passivation layer over the metal layer and etching the passivation layer with a fluorine-containing gas by which a fluorine-containing layer is formed on a surface of the bonding pad structure; b) dipping the substrate in a reducing solution for removing the fluorine-containing layer.

In accordance with another aspect of the present invention, the step a) preferably includes steps of: a1) forming the passivation layer over the metal layer; a2) coating a photo-sensitive layer over the passivation layer; a3) defining a pattern of the bonding pad over the photo-sensitive layer; a4) removing a portion of the photo-sensitive layer according to the pattern of the bonding pad by exposure and development for exposing a portion of the passivation layer; a5) descuming the exposed portion of the passivation layer by an oxygen-containing plasma; a6) curing the photo-sensitive layer; and a7) etching the passivation layer by the fluorine-containing gas for removing the exposed portion of the passivation layer and exposing a portion of the metal layer.

In accordance with another aspect of the present invention, the reducing solution preferably includes a tetramethyl ammonium hydroxide (TMAH).

In accordance with another aspect of the present invention, the step b) the substrate is preferably immersed in the reducing solution containing about 0.375% to about 85% the TMAH by weight for about 20 minute to about 3 second respectively.

The present invention may best be understood through the following description with reference to the accompanying drawings, in which:

DETAILED DESCRIPTION OF THE PREFERRED EMBODIMENTS

Figure 1:
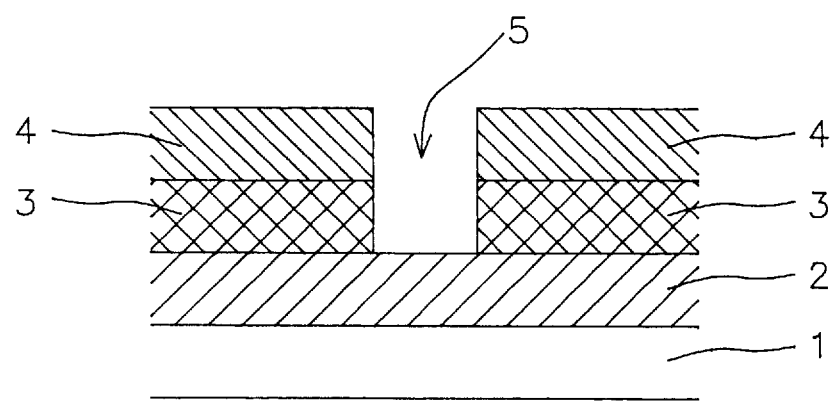
FIG. 1 illustrates a wafer having a bonding pad structure.
Figure 2A:
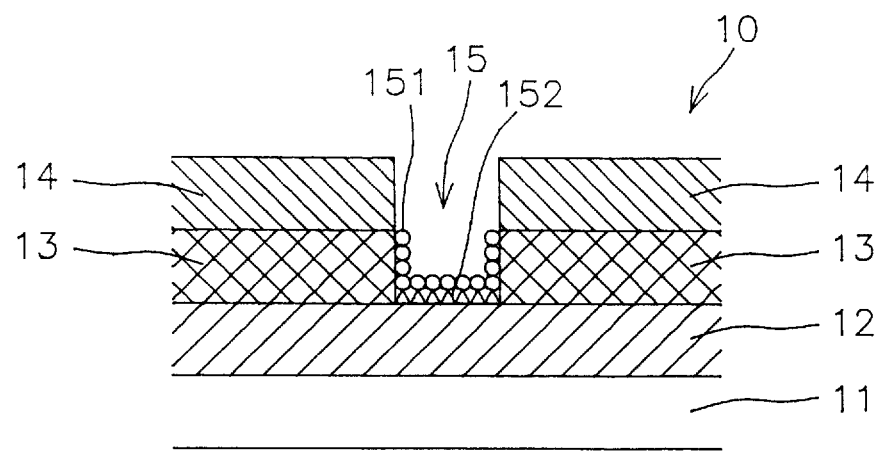
FIGS. 2(a), 2(b) illustrate a preferred embodiment of a process for manufacturing a bonding pad structure according to the present invention.
Figure 2B:
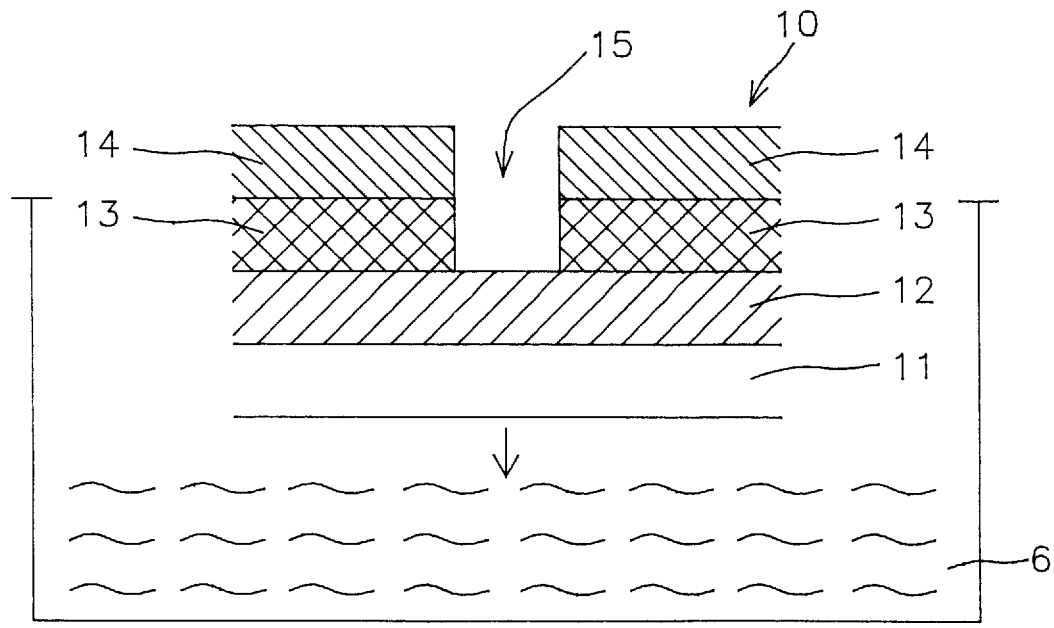

Referring to FIGS. 2(a), 2(b), which illustrate a preferred embodiment of the process for forming a bonding pad structure 15 according to the present invention. FIG. 2(a) may include steps of:

2a1) forming a metal layer 12 on the substrate 11 of the wafer 10;

2a2) forming a passivation layer 13 on metal layer 12;

2a3) forming a photo-resist layer on passivation layer 13;

2a4) patterning the photo-resist layer;

2a5) etching the passivation layer 13;

2a6) stripping the remaining photo-resist layer;

2a7) forming a polyimide layer 14 over the passivation layer 13;

2a8) defining a bonding pad window pattern on the polyimide layer 14;

2a9) forming the bonding pad window by exposure and development, and exposing a portion of the metal layer 12; and 2a10) curing the remaining portion of the polyimide layer 14.

FIG. 2(*a*) may be alternatively performed with the D. E. P.:

2a'1) forming a metal layer 12 on the substrate 11;

2a'2) forming a passivation layer 13 over the metal layer 12;

2a'3) forming a polyimide layer 14 over the passivation layer 13;

2a'4) defining a pattern of a bonding pad window on the polyimide layer 14;

2a'5) exposing a portion of the passivation layer 13 according to the pattern of the bonding pad window by exposure and development;

2a'6) curing the remaining portion of the polyimide layer; and

2a'7) etching the exposed portion of the passivation layer 13 for forming the bonding pad structure 15.

The metal layer 12, in both cases described above, may be an Al-Si-Cu alloy layer or an Al-Cu layer formed by a sputtering method. The passivation layer 13 may be a silicon dioxide layer formed by an atmospheric chemical vapor deposition (APCVD) or a plasma-enhanced CVD (PECVD), a phosphosilicate glass (PSG) layer or a borophosphosilicate glass (BPSG) layer formed by an APCVD or a PECVD, or a silicon-oxy-nitride layer formed by a PECVD.

The etching gases used in step 2a5) and step 2a'7) may form a fluorocarbon polymer 151 or a metal fluoride 152.

FIG. 2(*b*) includes step of:

dipping the bonding pad structure 15 in a basic solution 6 for removing the fluorocarbon polymer 151 and the metal fluoride 152.

The basic solution may contain tetramethyl ammonium hydroxide (TMAH) for about 0.375% to about 85%. The dipping time depends on the concentration of the TMAH. When the concentration of the TMHA increases from 0.375% to 85%, the dipping time decreases from 20 minutes to 3 seconds, respectively.

Figure 3A:
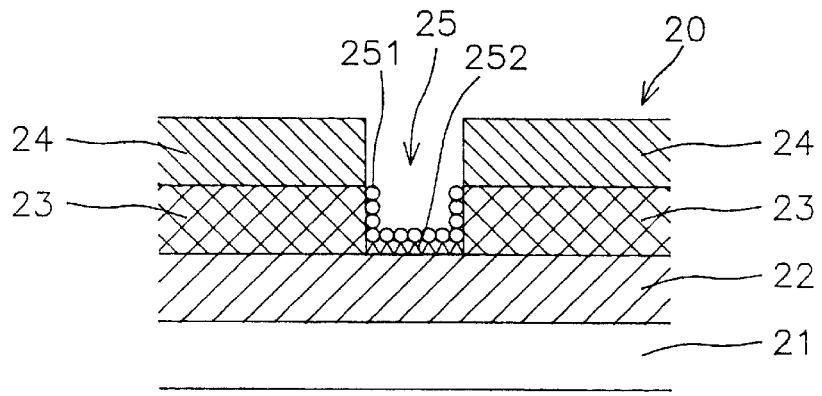
FIGS. 3(a)–3(c) illustrate another preferred embodiment of a process for manufacturing a bonding pad structure according to the present invention.
Figure 3B:
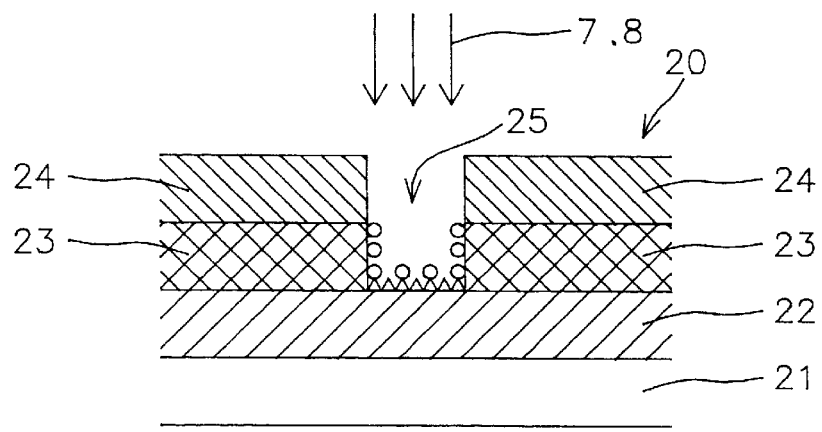
Figure 3C:
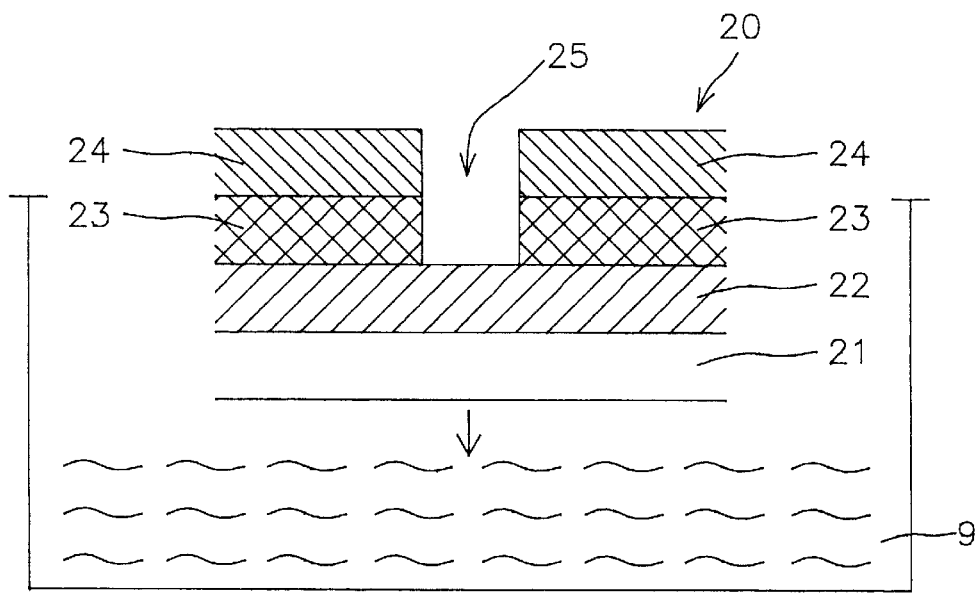

FIGS. 3(*a*)–3(*c*) are illustrations of another preferred embodiment of the present invention. The processes of FIGS. 3(*a*) and 3(*c*) are similar to those of FIG. 2(*a*) and 2(*b*), respectively. However, for removing the fluorocarbon polymer 251 and the metal fluoride 252 more properly, a soft etching process shown in FIG. 3(*b*) is introduced. Such a process includes a step of etching the bonding pad structure 25 by a plasma 7 in a relatively short time for removing a portion of the fluorocarbon polymer 251 on the bonding pad structure 25 of the wafer 20.

If necessary, there further includes an ashing process after the soft etching step for etching the ash contained on the bonding pad structure 25 by an oxygen-containing plasma 8.

To prove the advantage and effect of the present invention, the fluorine contents of the bonding pad structures of the wafers shown in FIGS. 2(*a*), 2(*b*), 3(*a*) and 3(*c*) are detected by an X-ray photoelectron spectroscopy (XPS). The bonding pad structures which are not treated by any fluorine-reducing procedure (FIGS. 2(*a*) and 3(*a*)) contain about 43.8% fluorine. When the wafer has been dipped in the TMHA solution (FIG. 2(*b*)), the fluorine content is reduced to 3.1%. If the wafer is treated by both soft etching and TMHA dipping processes (FIG. 3(*c*)), there only contents 0.3% fluorine in the bonding pad structure! Furthermore, a fourier transform infrared spectra (FTIR) indicates that the chemical structure of the cured polyimide will not be destroyed by the TMHA treatment.

It is obvious that the soft etching process and the TMHA treatment of the present invention can clean the surface of the bonding pad structure properly without damaging the polyimide and passivation layers. The present invention provides a reliable process for manufacturing a low contact resistance bonding pad.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for forming a bonding pad having a low contact resistance, comprising steps of:

a) forming a bonding pad structure on a substrate having a metal layer by forming a passivation layer over said metal layer and etching said passivation layer with a fluorine-containing gas by which a fluorine-containing layer is formed on a surface of said bonding pad structure; and b) removing said fluorine-containing layer for reducing a contact resistance of said bonding pad structure.

2. A method according to claim 1 wherein said fluorine-containing gas is one selected from the group consisting of $CF_4$, $CHF_3$, $C_2F_6$, $C_3F_8$ and $NF_3$.

3. A method according to claim 1 wherein said fluorine-containing layer includes a fluorine-containing polymer.

4. A method according to claim 3 wherein said fluorine-containing polymer is a fluorocarbon polymer.

5. A method according to claim 3 wherein said fluorine-containing layer further includes a fluoride formed by a reaction between said fluorine-containing gas and said metal layer.

6. A method according to claim 5 wherein said metal layer is an aluminum-containing layer.

7. A method according to claim 6 wherein said aluminum-containing layer is an Al-Si-Cu alloy layer.

8. A method according to claim 6 wherein said aluminum-containing layer is an Al-Cu alloy layer.

9. A method according to claim 6 wherein said fluoride layer is an aluminum fluoride layer.

10. A method according to claim 5 wherein said step b) includes steps of:

b1) soft-etching said bonding pad structure for removing a portion of said fluorine-containing polymer; and b2) dipping said substrate in a reducing solution for removing said fluoride and a remaining portion of said fluorine-containing polymer.

11. A method according to claim 10 wherein said soft etching is a plasma etching during a relatively short time interval.

12. A method according to claim 10 wherein said reducing solution is a basic solution.

13. A method according to claim 12 wherein said basic solution includes a tetramethyl ammonium hydroxide (TMAH).

14. A method according to claim 13 wherein in said step b2) said substrate is immersed in said basic solution containing about 0.375% to about 85% said TMAH by weight for about 20 minute to about 3 second respectively.

15. A method according to claim 10, further includes a step between step b1) and step b2):

b11) etching an ash on said bonding pad structure by an oxygen-containing plasma.

16. A method according to claim 1 wherein said step a) includes steps of:
   a1) forming said passivation layer over said metal layer;
   a2) coating a photo-sensitive layer over said passivation layer;
   a3) defining a pattern of said bonding pad over said photo-sensitive layer;
   a4) removing a portion of said photo-sensitive layer according to said pattern of said bonding pad by exposure and development for exposing a portion of said passivation layer;
   a5) descuming said exposed portion of said passivation layer by an oxygen-containing plasma;
   a6) curing said photo-sensitive layer; and
   a7) etching said passivation layer by said fluorine-containing gas for removing said exposed portion of said passivation layer and exposing a portion of said metal layer.

17. A method according to claim 16 wherein said photo-sensitive layer is a photo-sensitive polyimide layer.

18. A method according to claim 1, further includes a step between step a) and step b):
   b0) etching an ash on said bounding pad structure by an oxygen-containing plasma.

19. A method according to claim 1 wherein said passivation layer is a silicon dioxide layer.

20. A method according to claim 1 wherein said passivation layer is a silicon nitride layer.

21. A method according to claim 1 wherein said passivation layer is a phosphosilicate glass (PSG) layer.

22. A method according to claim 1 wherein said passivation layer is a borophosphosilicate glass (BPSG) layer.

23. A method according to claim 1 wherein said passivation layer is a silicon-oxy-nitride layer.

24. A method according to claim 1 wherein in step a) said passivation layer is etched by a reactive ion etching method with said fluorine-containing gas.

25. A method according to claim 24 wherein said reactive ion etching is executed by a fluorocarbon plasma.

26. A method for forming a bonding pad having a low contact resistance, comprising steps of:
   a) forming a bonding pad structure on a substrate having a metal layer by forming a passivation layer over said metal layer and etching said passivation layer with a fluorine-containing gas by which a fluorine-containing layer is formed on a surface of said bonding pad structure;
   b) dipping said substrate in a reducing solution for removing said fluorine-containing layer.

27. A method according claim 26 wherein said step a) includes steps of:
   a1) forming said passivation layer over said metal layer;
   a2) coating a photo-sensitive layer over said passivation layer;
   a3) defining a pattern of said bonding pad over said photo-sensitive layer;
   a4) removing a portion of said photo-sensitive layer according to said pattern of said bonding pad by exposure and development for exposing a portion of said passivation layer;
   a5) descuming said exposed portion of said passivation layer by an oxygen-containing plasma;
   a6) curing said photo-sensitive layer; and
   a7) etching said passivation layer by said fluorine-containing gas for removing said exposed portion of said passivation layer and exposing a portion of said metal layer.

28. A method according to claim 26 wherein said reducing solution includes a tetramethyl ammonium hydroxide (TMAH).

29. A method according to claim 26 wherein in said step b) said substrate is immersed in said reducing solution containing about 0.375% to about 85% said TMAH by weight for about 20 minute to about 3 second respectively.

* * * * *